US006818534B2

United States Patent
Davis et al.

(12)

(10) Patent No.: US 6,818,534 B2
(45) Date of Patent: Nov. 16, 2004

(54) DRAM HAVING IMPROVED LEAKAGE PERFORMANCE AND METHOD FOR MAKING SAME

(75) Inventors: Jonathan Philip Davis, Mechanicsville, VA (US); Stephen M. Rusinko, Jr., Chester, VA (US)

(73) Assignee: Infineon Technologies Richmond, LP, Sandston, VA (US)

( * ) Notice: Subject to any disclaimer, the term of this patent is extended or adjusted under 35 U.S.C. 154(b) by 0 days.

(21) Appl. No.: 10/223,511

(22) Filed: Aug. 19, 2002

(65) Prior Publication Data

US 2004/0031992 A1 Feb. 19, 2004

(51) Int. Cl.$^7$ ................................................ H01L 29/72
(52) U.S. Cl. ....................... 438/521; 438/522; 438/524; 438/525
(58) Field of Search .................................. 438/521, 522, 438/524, 525; 257/349, 350, 352, 355

(56) References Cited

U.S. PATENT DOCUMENTS 4,704,368 A * 11/1987 Goth et al. ................. 257/349
6,310,375 B1 * 10/2001 Schrems ..................... 257/349

* cited by examiner

Primary Examiner—Edward Wojciechowicz

(57) ABSTRACT

A semiconductor memory device comprises a trench etched from a substrate below a shallow trench isolation and a doped collar oxide. The device further comprises a buried-strap junction formed adjacent to the shallow trench isolation and above the collar oxide, and a channel stop formed below the buried-strap junction, wherein a junction between the channel stop and the buried-strap junction is formed in the substrate.

4 Claims, 5 Drawing Sheets

DRAM HAVING IMPROVED LEAKAGE PERFORMANCE AND METHOD FOR MAKING SAME

BACKGROUND OF THE INVENTION

1. Field of the Invention

The present invention relates to semiconductors, and more particularly to leakage performance in trench DRAM.

2. Discussion of Related Art

In trench DRAM, retention of an electric charge in a cell capacitor is largely a function of various leakage mechanisms. These mechanisms include, for example, a sub-STI leakage and reverse-bias leakage at the buried strap junction.

Referring to FIG. 1, the BEST (BuriEd-STrap) cell uses a collar oxide 101 at a top portion of the trench to isolate the capacitor 103 from an access transistor at the silicon (Si) surface. The buried-strap 107 connects a word-line 105 to the capacitor 103. FIG. 2 shows a detailed view of the region near the buried-strap 107.

Referring to FIG. 2, an As-doped poly-Si 201 creates the n+ buried-strap junction 107 by outdiffusion of As into single-crystal Si. When outdiffused, the p-dopant helps form a more abrupt junction with improved reverse bias leakage behavior. However, a weakly doped region 203 can form at the top of the collar oxide 101 below the buried-strap junction 107. Thus, the topography can make it difficult to dope this region, compromising the reverse bias leakage performance of the device.

Therefore, a need exists for a device having improved charge retention through improved reverse bias leakage.

SUMMARY OF THE INVENTION

A semiconductor memory device comprises a trench etched from a substrate below a shallow trench isolation and a doped collar oxide. The device further comprises a buried-strap junction formed adjacent to the shallow trench isolation and above the collar oxide, and a channel stop formed below the buried-strap junction, wherein a junction between the channel stop and the buried-strap junction is formed in the substrate.

The collar oxide is a boro-silicate glass. The boro-silicate glass comprises about 6% Boron by weight.

The oxide collar is p-doped. The channel stop comprises a region of p-doped substrate.

According to embodiment of the present invention, a method of manufacturing a semiconductor memory device comprises providing a substrate, forming a trench in the substrate, wherein the trench comprises sidewalls, and forming a layer of poly-silicon in a bottom portion of the trench. The method further comprises forming a collar on the sidewalls of the trench, forming a second layer of poly-silicon in a second bottom portion of the trench, and removing a top portion of the collar. The method forms a third layer of poly-silicon in a third bottom portion of the trench, wherein the third layer of poly-silicon is in contact with a top portion of the collar, forms an isolation region in a portion of the substrate, wherein the isolation region caps the trench, and outdiffuses dopants from the third layer of poly-silicon and the collar into the substrate.

The method further comprises planarizing the surface of the substrate after forming the isolation region, wherein the substrate comprises a silicon layer and a top nitride layer.

The outdiffusion of dopants from the third layer of poly-silicon forms a buried-strap junction and the outdiffusion of dopants from the collar forms a channel stop.

According to an embodiment of the present invention, a semiconductor memory device comprises a buried-strap trench cell capacitor comprising a collar oxide deposited on a portion of a trench sidewall and a channel stop, outdiffused into a substrate and position substantially beneath a buried-strap of the buried-strap trench cell capacitor.

BRIEF DESCRIPTION OF THE DRAWINGS

Preferred embodiments of the present invention will be described below in more detail, with reference to the accompanying drawings.

DETAILED DESCRIPTION OF PREFERRED EMBODIMENTS

According to an embodiment of the present invention, a trench dynamic random access memory (DRAM) comprises an oxide collar formed of, for example, a boro-silicate glass (BSG). The oxide collar can be formed by using, for example, a p-type doped oxide, e.g., $SiO_2$. Outdiffusion of the p-dopants can form a channel stop under a shallow-trench isolation (STI) and increase the doping in the p-type side of a buried-strap junction, making the junction more abrupt.

Figure 1:
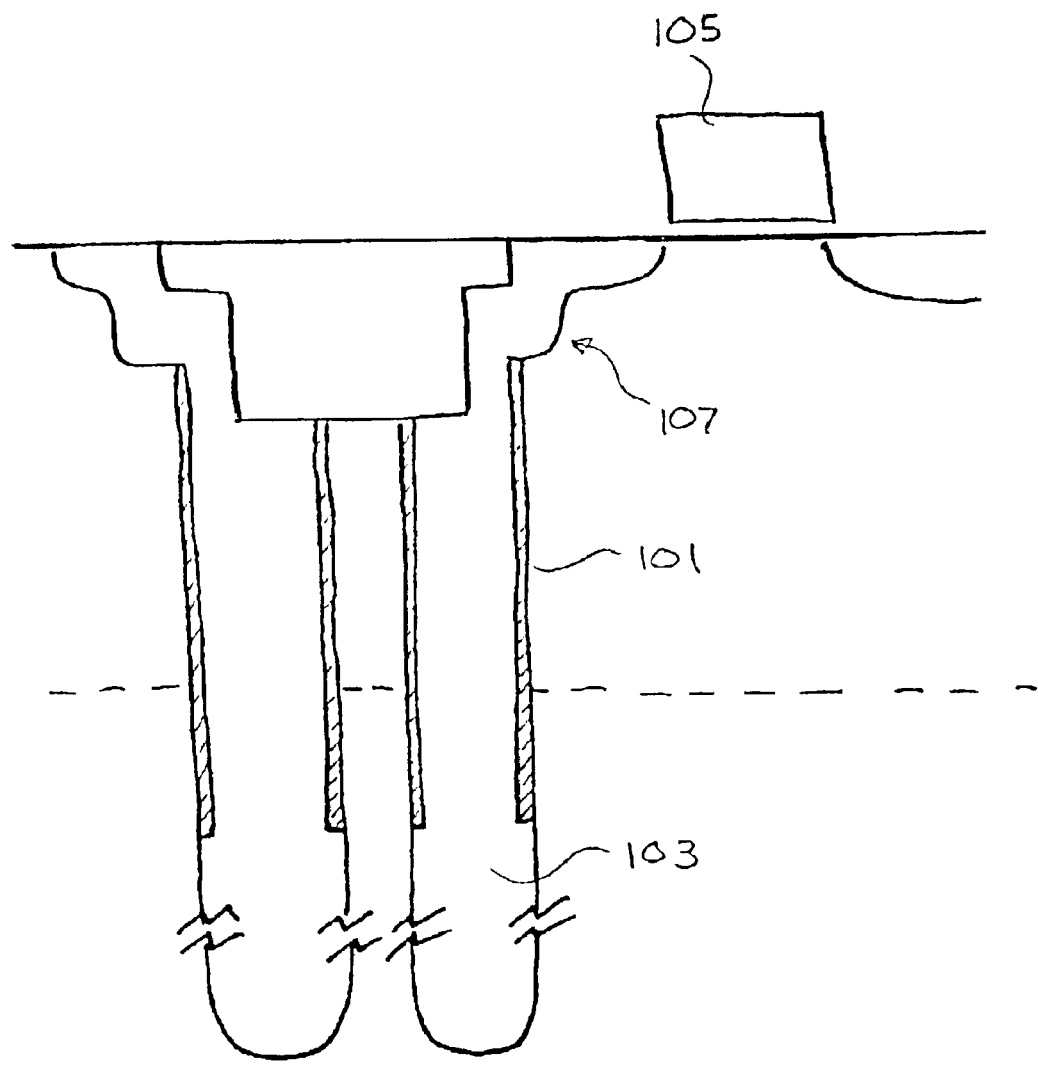
FIG. 1 is a diagram of a buried strap trench DRAM cell.
Figure 2:
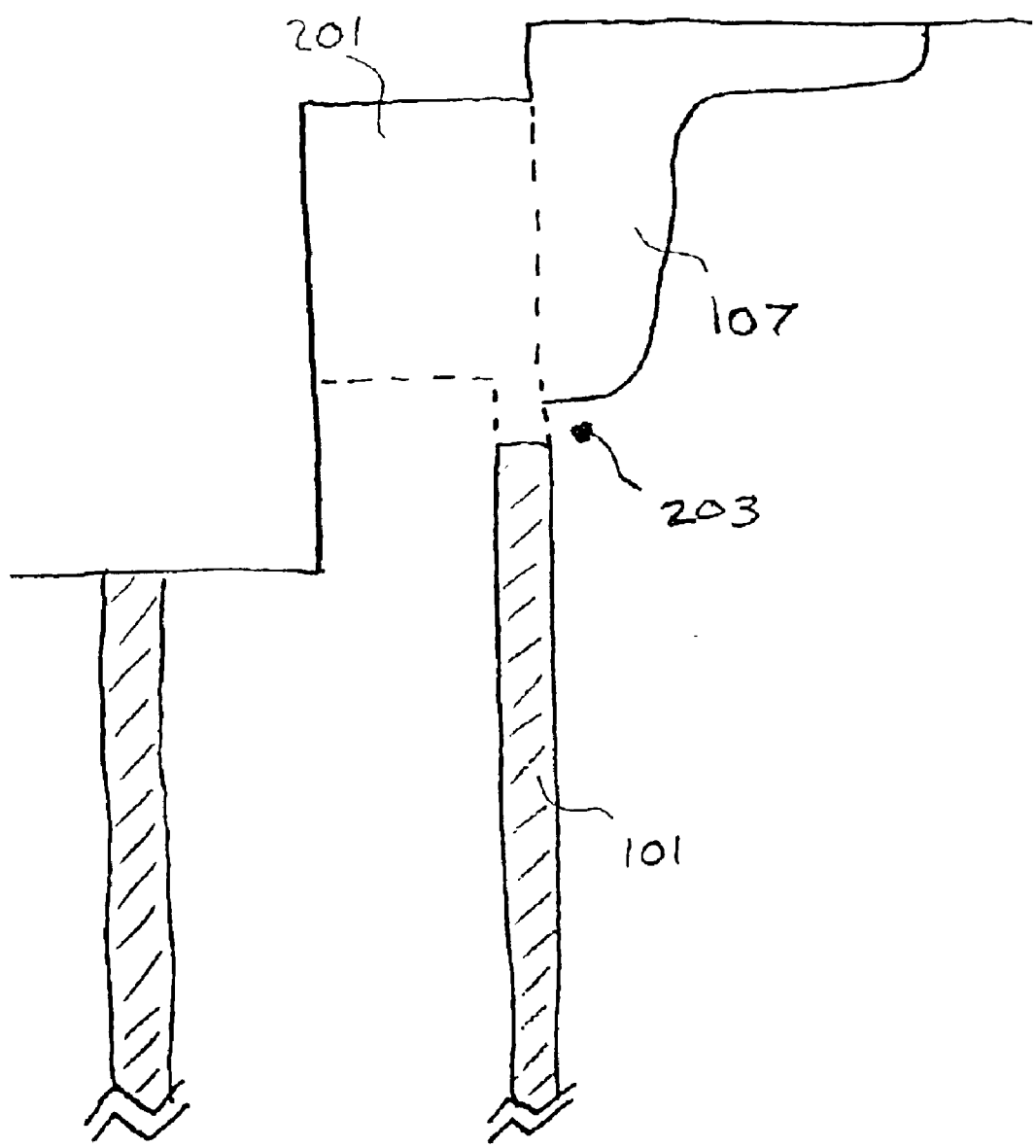
FIG. 2 is a diagram of the buried-strap junction of FIG. 1.
Figure 3:
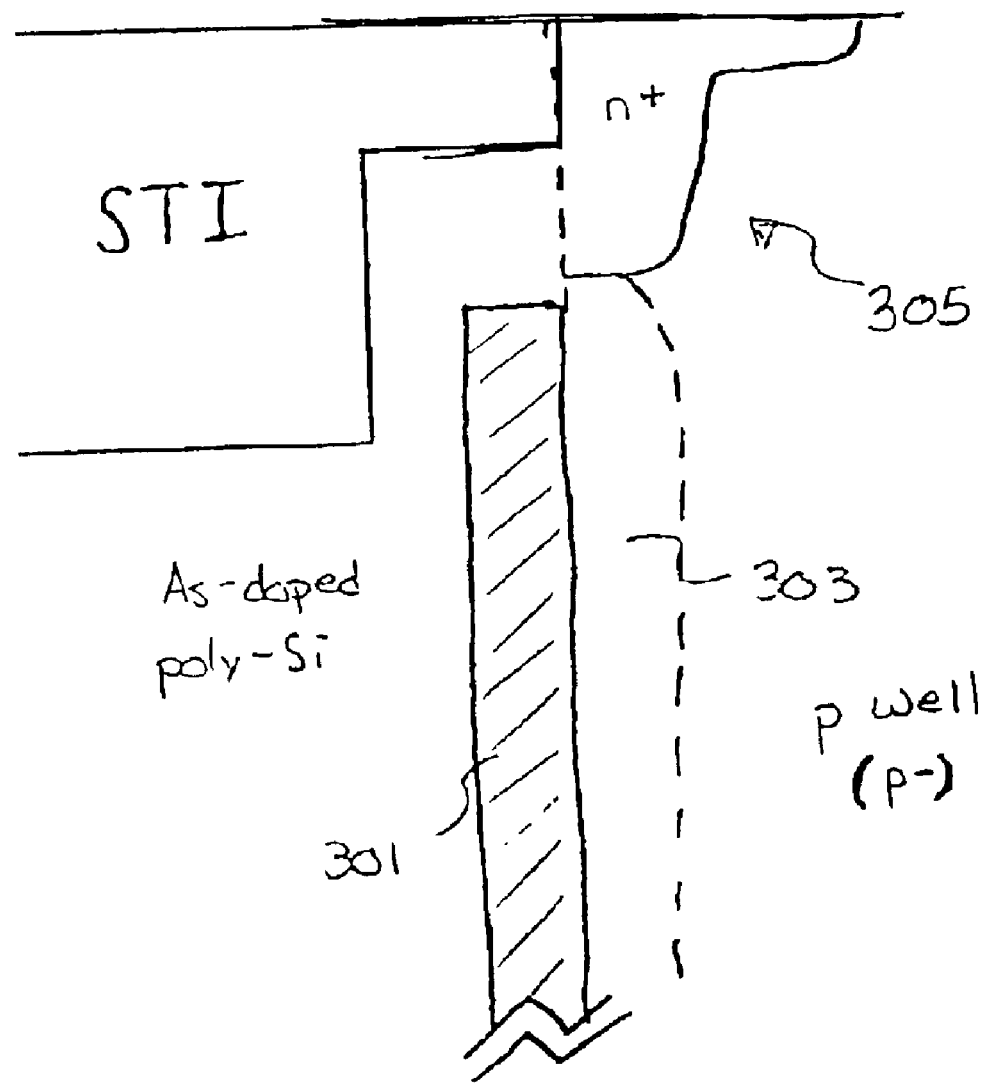
FIG. 3 is a diagram of a buried-strap junction according to an embodiment of the present invention.

Referring to FIG. 3, the sub-STI region can be seen, including a p-doped collar oxide 301 for doping a region 303 of Si under the buried-strap junction 305. The region forms a filed channel stop 303 comprising an elevated level of p-dopants. The boundary between the buried-strap junction 305 and the channel stop 303 is more abrupt than in devices without a channel stop. The enhanced boundary produces improved reverse bias leakage performance.

The dopant level in the DRAM collar film 301 needs to be significant to produce enough outdiffusion into the Si substrate. In the case of BSG, about 6% Boron by weight can be used. However, high levels of doping can result in unstable and/or very fast etch rates of the film.

Figure 4:
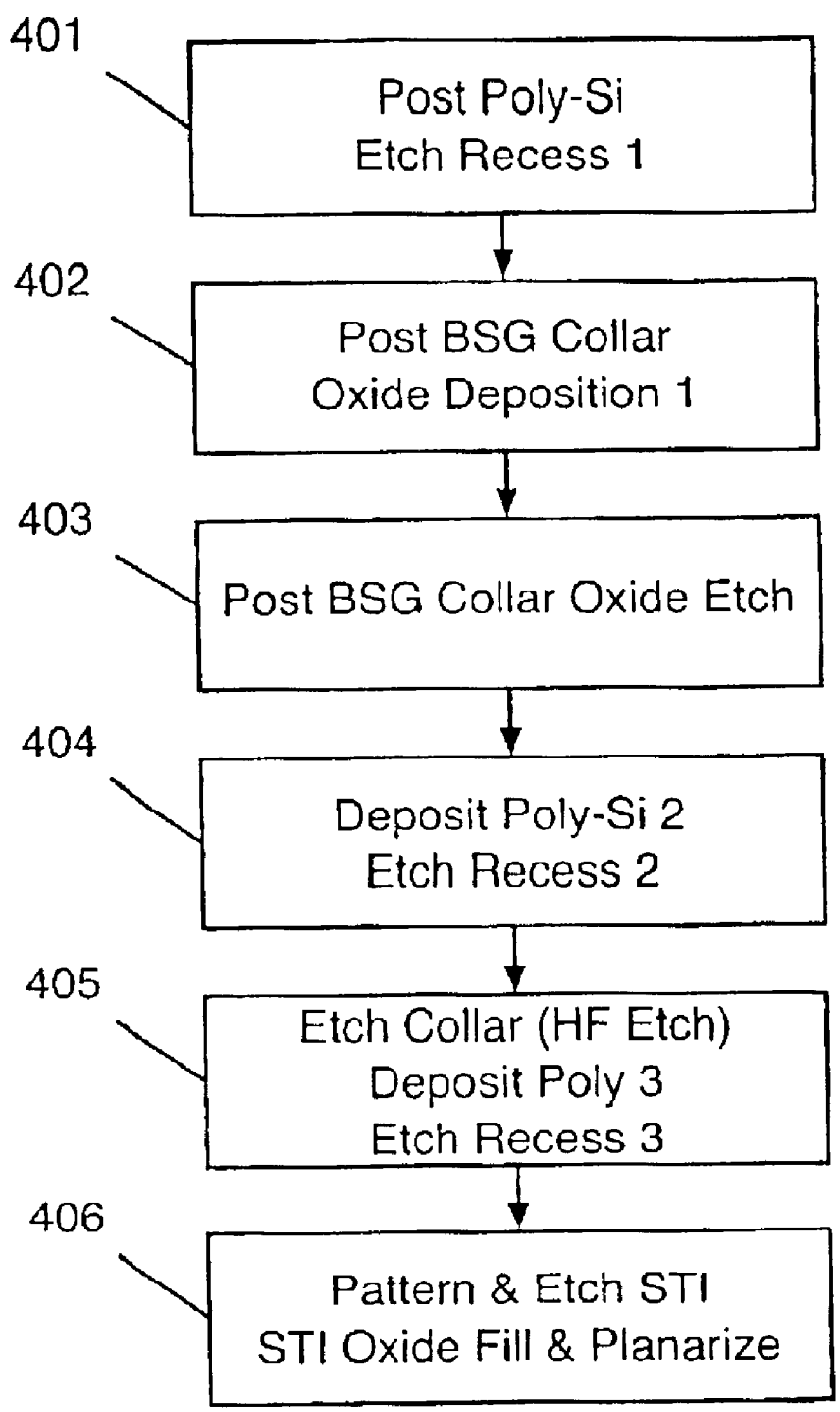
FIG. 4 is a flow chart of a method according to an embodiment of the present invention.
Figure 5A:
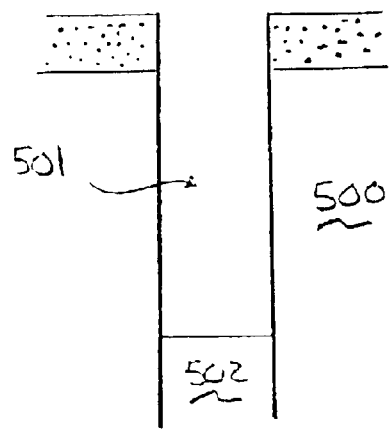
FIGS. 5a to 5f are diagrams of a cell capacitor at various points referred to in FIG. 4, according to an embodiment of the present invention.
Figure 5B:
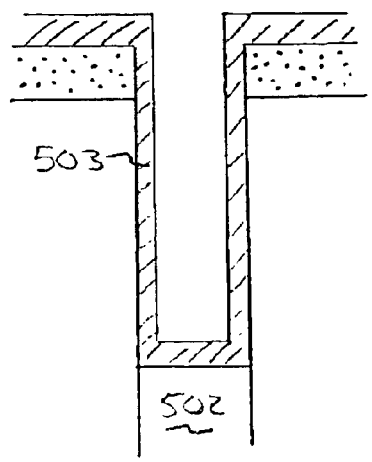
Figure 5C:
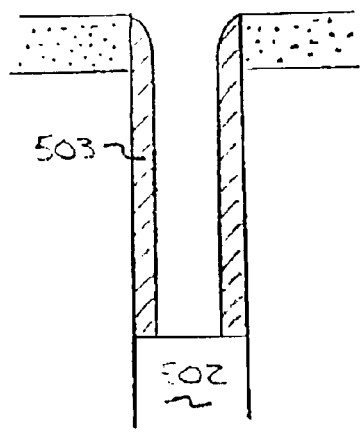
Figure 5D:
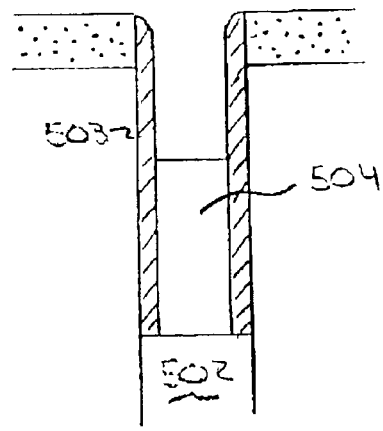
Figure 5E:
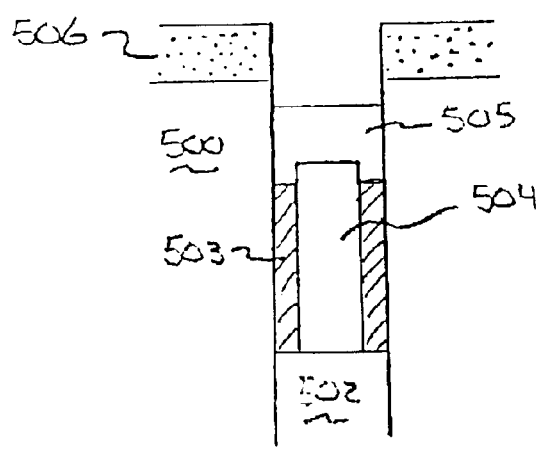
Figure 5F:
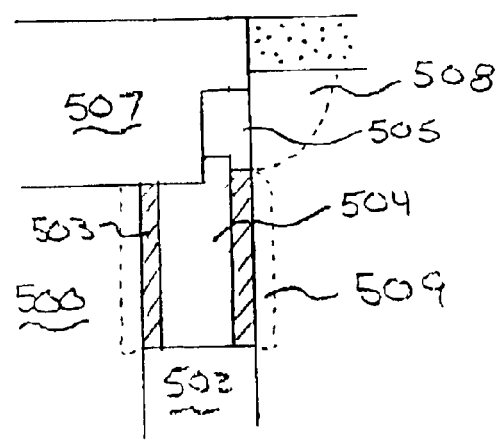

Referring to FIG. 4, a cell capacitor trench can be filled with poly-Si and etched 401 to recess the poly-Si. The recess can be about 1 $\mu$m deep. A BSG layer can be depositing on over the device 402 by, for example, oxide deposition. An oxide etch can be used to remove the BSG from the surface of the device 403. A second poly-Si layer can be deposited in the recess and recessed 404. The recess can be about 0.2 $\mu$m deep. The BSG collar can be etched, for example, by hydrofluoric acid (HF), to remove a portion exposed near or above the second poly-Si. A third poly-Si layer can be deposited and etched to recess below a nitride layer at the surface of the device 405. The device can be patterned and etched to formed a shallow trench isolation (STI) region. The STI can be filling with an oxide and planarized to the surface of the device 406.

Referring to FIGS. 5a to 5f, a cell capacitor trench 501 is formed in a substrate 500, such as Si. Poly-Si 502 can be deposited in the bottom portion of the trench. A BSG layer 503 can be depositing by, for example, oxide deposition. The BSG 503 can be removed from the surface of the device and the bottom of the trench, forming a collar. A second poly-Si layer 504 can be deposited in the trench. The collar 503 can be etched to remove a portion exposed near or above the second poly-Si 504. A third poly-Si layer 505 can be deposited and etched to recess below a nitride layer 506 at the surface of the device, wherein the substrate 500 further comprises the nitride layer 506. The STI region 507 can be formed in the substrate. The STI can be filling with an oxide and planarized to the surface of the device. The buried-strap region 508 and channel stop region 509 are formed by outdiffusion of dopants into the substrate. The dopants can be, for example, As for the buried-strap and B for the channel stop. The addition of the channel stop improves reverse bias leakage in the cell capacitor.

Having described embodiments for a trench DRAM having improved leakage characteristics, it is noted that modifications and variations can be made by persons skilled in the art in light of the above teachings. It is therefore to be understood that changes may be made in the particular embodiments of the invention disclosed which are within the scope and spirit of the invention as defined by the appended claims. Having thus described the invention with the details and particularity required by the patent laws, what is claimed and desired protected by Letters Patent is set forth in the appended claims.

What is claimed is:

1. A method of manufacturing a semiconductor memory device comprising the steps of:

providing a substrate;

forming a trench in the substrate, wherein the trench comprises sidewalls;

forming a first layer of poly-silicon in a bottom portion of the trench;

forming a collar on the sidewalls of the trench above the first layer of poly-silicon;

forming a second layer of poly-silicon in a second bottom portion of the trench above the first layer of poly-silicon;

removing a top portion of the collar;

forming a third layer of poly-silicon in a third bottom portion of the trench, wherein the third layer of poly-silicon is in contact with a top portion of the collar and a top portion of the second layer of poly-silicon;

forming an isolation region in a portion of the substrate, wherein the isolation region caps the trench; and outdiffusing dopants from the third layer of poly-silicon and the collar into the substrate.

2. The method of claim 1, further comprising the step of planarizing the surface of the substrate after forming the isolation region, wherein the substrate comprises a silicon layer and a top nitride layer.

3. The method of claim 1, wherein the outdiffusion of dopants from the third layer of poly-silicon forms a buried-strap junction and the outdiffusion of dopants from the collar forms a channel stop.

4. The method of claim 3, wherein the channel stop contacts a bottom portion of the buried strap.

\* \* \* \* \*